(12) United States Patent
Serban et al.

(10) Patent No.: US 7,800,586 B2
(45) Date of Patent: Sep. 21, 2010

(54) DATA INPUT DEVICE

(75) Inventors: Bogdan Serban, Leudelange (LU);
Philippe Boyer, Cattenom (FR)

(73) Assignee: IEE International Elecronics & Engineering S.A., Echternach (LU)

( * ) Notice: Subject to any disclaimer, the term of this patent is extended or adjusted under 35 U.S.C. 154(b) by 640 days.

(21) Appl. No.: 10/535,399

(22) PCT Filed: Nov. 24, 2003

(86) PCT No.: PCT/EP03/50887

§ 371 (c)(1),
(2), (4) Date: Feb. 8, 2006

(87) PCT Pub. No.: WO2004/049364

PCT Pub. Date: Jun. 10, 2004

(65) Prior Publication Data

US 2006/0158433 A1   Jul. 20, 2006

(30) Foreign Application Priority Data

Nov. 25, 2002  (EP) .................................. 02026166
Dec. 19, 2002  (LU) ...................................... 90 995
Apr. 16, 2003  (LU) ...................................... 91 020

(51) Int. Cl.
*G09G 5/00* (2006.01)
(52) U.S. Cl. ...................................... 345/168; 345/173
(58) Field of Classification Search .................. 345/156, 345/168–173; 340/407
See application file for complete search history.

(56) References Cited

U.S. PATENT DOCUMENTS

| 4,429,301 | A | * | 1/1984 | Crumley et al. | ................ 341/22 |
| 4,810,992 | A | * | 3/1989 | Eventoff | ....................... 338/99 |
| 5,159,159 | A | * | 10/1992 | Asher | ....................... 178/18.05 |

FOREIGN PATENT DOCUMENTS

| EP | 0 134 853 |   | 3/1985 |
| EP | 0 266 229 |   | 5/1988 |
| EP | 0 489 344 |   | 6/1992 |
| EP | 0 917 293 |   | 5/1999 |
| FR | EP0266229 | * | 5/1988 |
| LU | 88 024    |   | 7/1992 |

OTHER PUBLICATIONS

U.S. Appl. No. 10/553,657, filed Oct. 14, 2005, Serban.
U.S. Appl. No. 10/499,294, filed Dec. 15, 2004, Serban.

* cited by examiner

*Primary Examiner*—Kevin M Nguyen
*Assistant Examiner*—Kenneth B Lee, Jr.
(74) *Attorney, Agent, or Firm*—Oblon, Spivak, McClelland, Maier & Neustadt, L.L.P.

(57) ABSTRACT

A data input device including plural keys that are arranged over at least two lines. A unidirectional position detector is associated with each line of keys and each unidirectional position detector includes a first input connection, a second input connection, and an output connection. The output connections of the unidirectional position detectors are connected at different locations to a first ohmic resistor. In addition, the first input connections are connected to a first terminal of the data input device and the second input connections are connected to a second terminal of the data input device.

20 Claims, 9 Drawing Sheets

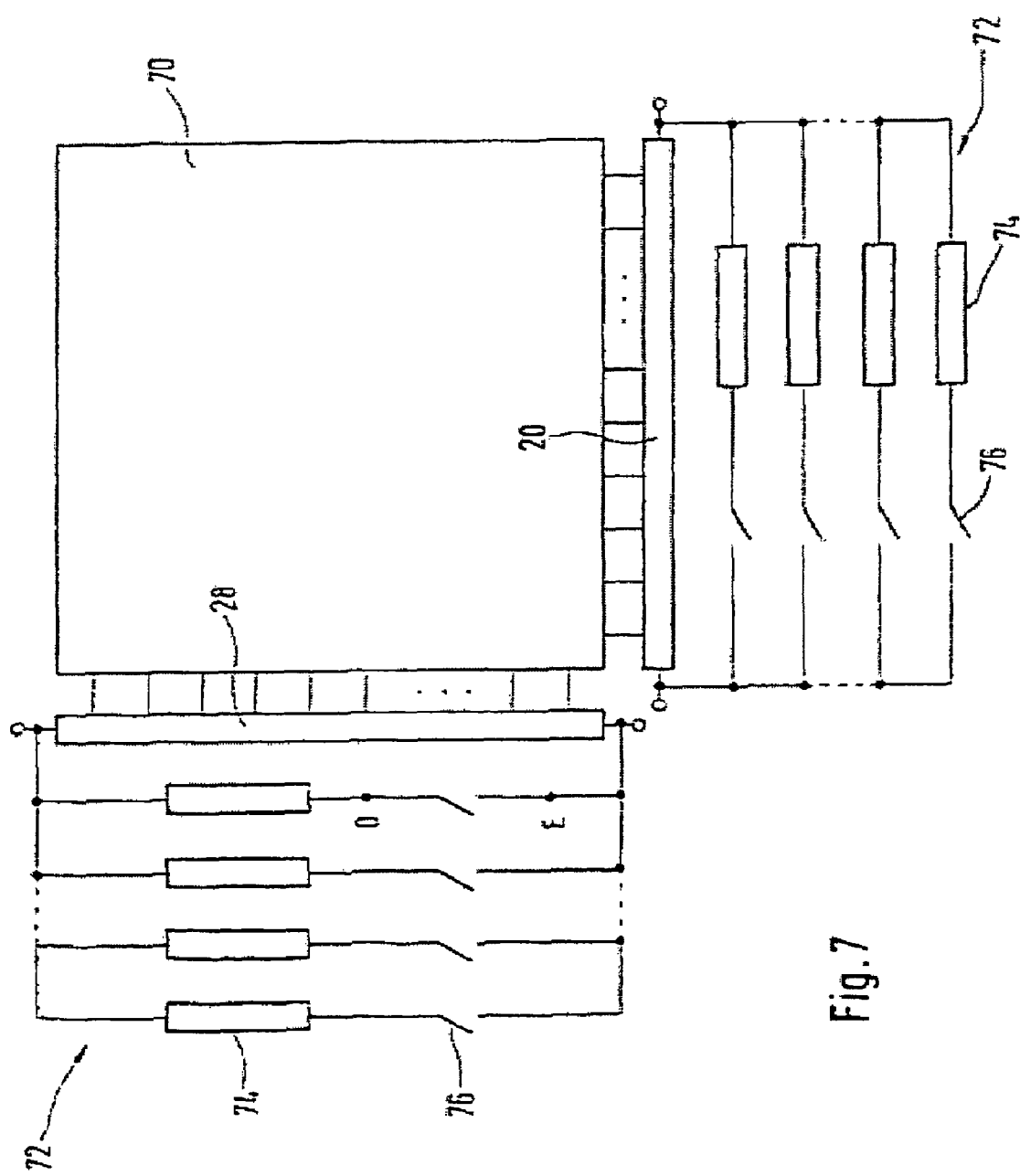

DATA INPUT DEVICE

INTRODUCTION

Figure 1:
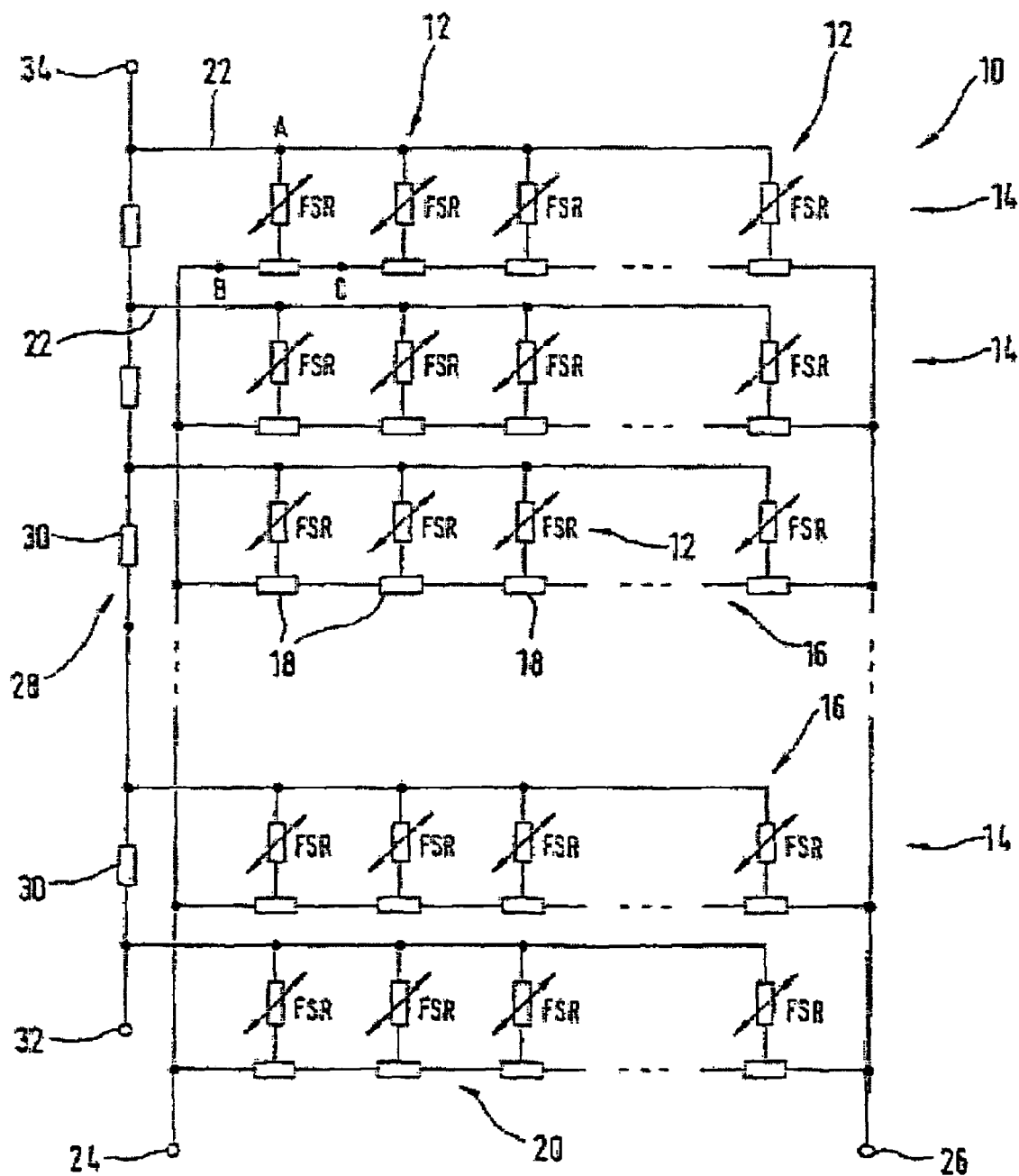

The present invention relates to a data input device and especially a keyboard, such as e.g. a numeric or alphanumeric keyboard.

It is known to construct data input devices, such as numeric or alphanumeric keyboards, from switches of the lamina type. A switch of the lamina type comprises two support laminas, which are arranged at a certain distance from one another with the aid of a separator. The separator comprises at least one recess which defines an active zone of the switch, in which the two support laminas face one another. Inside this active zone, at least two electrodes are arranged in such a way on the two support laminas, that electrical contact is established between the electrodes when the two support laminas are pressed together under the effect of a force acting on the switch.

Depending on the applications, a layer of semiconducting material may be disposed between the electrodes, so that the switch shows a pressure sensitive behavior, that is to say its resistance varies as a function of the force applied. The variable nature of the electrical resistance of such switches, which are known by the name "Force Sensing Resistors", makes it possible to use these switches as pressure sensors. The layer of semiconducting material may comprise either a material whose internal electrical resistance varies as a function of a compression or of a deformation of the layer or a material whose surface structuration confers a certain surface resistance on the layer, which, when the layer is applied against a conducting surface of the electrode may be reduced following an increase in the number of points of contact with this conducting surface under the effect of a localized pressure.

A data input device using such switches of the lamina type is described in document EP-A-0 489 344. This device comprises a plurality of switches arranged in the form of a grid or matrix at the locations intended for keys of the keyboard. In order to connect the various switches with a circuit for identifying the keys, the switches are interconnected as a matrix, each switch being connected between a row connector and a column connector respectively. A keyboard comprising a number (n*m) of keys, that is to say (n*m) switches, arranged in n rows and m columns thus requires at least n row conductors and m column conductors in order to make it possible to individually interrogate the n*m switches (n and m representing any integers). Consequently, this device requires n+m connections with the exterior so as to be able to connect the keyboard to a unit for identifying the keys.

In order to reduce the number of connections with the exterior, keyboards comprising an XYZ digitizing tablet, that is to say a force position and intensity detector, have been presented. These digitizing tablets use pressure sensors configured as a linear potentiometer so as to determine the location of the action of a force. To this end, each of the pressure sensors comprises a linear resistor disposed on a support to the terminals of which is applied a voltage so as to create a potential gradient. At regular intervals, conducting lines extending laterally are connected to said linear resistor. The slider of the potentiometer is formed by a comb-like conductor whose teeth extend between the conducting lines. By short-circuiting the conducting lines with the teeth of the conductor at a certain location, the conductor is subjected to a voltage which varies linearly with the position of the conducting line on the linear resistor. Such a pressure sensor therefore makes it possible to determine the position of the action of a force in the direction of the linear resistor.

By overlaying two of these force sensors in such a way that their respective linear resistors are oriented in an angle of e.g. 90° mutually, a position detector is created which makes it possible to identify the position of action of a force in an X-Y reference frame on a surface. This characteristic may obviously be used to identify an activated key of a keyboard. Such a keyboard is e.g. described in document LU-A-88 024. In such a keyboard, each of the two potentiometer-like force sensors requires three connections, namely a connection on each of the two terminals of the linear resistor and a connection for the slider. As a result, such a keyboard makes it possible to reduce the number of connections with the exterior with respect to a "matrix" keyboard. Specifically, instead of requiring a number of (n×m) connections (e.g. 12 connections for a numeric keyboard with 3×4 keys), this type of keyboard is happy with six exterior connections.

Object Of The Invention

The object of the present invention is to propose a data input device which further reduces the number of exterior connections.

General Description of the Invention

In accordance with the invention, this object is achieved by the data input device according to claim 1. Such a data input device comprises several keys, said keys being arranged in at least two rows. A unidirectional position detector is associated with each row of keys, each unidirectional position detector comprising a first input connection, a second input connection and an output connection. The output connections of the unidirectional position detectors are connected at various locations to a first ohmic resistor. The first input connections are connected to a first terminal of the data input device and the second input connections are connected to a second terminal of the data input device.

A numeric keyboard embodied in accordance with the teaching of the first claim and having four rows, each with three keys (12 keys in total), therefore comprises four unidirectional position detectors, one of which is associated with each row of keys. These unidirectional position detectors make it possible to detect the position of a force applied to the keyboard and thus to identify the key of the row in question which is activated. This unidirectional position detector therefore makes it possible to identify an X coordinate of a force acting on the keyboard.

In order to determine the row of keys which comprises the activated key, that is to say to determine a Y coordinate of a force acting on the keyboard, the various unidirectional position detectors are wired to a first ohmic resistor in a voltage divider layout. Specifically, by applying a potential difference to the first ohmic resistor, the various position detectors are subjected to different voltages by reason of their position of connection on the first ohmic resistor. By measuring the voltage at the first or the second terminal of the keyboard, it is consequently possible to identify the position detector which is activated and consequently the row comprising the activated key.

The present invention therefore proposes a data input device such as a keyboard, which requires only 4 exterior connections to determine the X-Y coordinates of the action of a force on the keyboard and hence to identify an activated key. These 4 connections are in particular the first and second terminals to which are respectively connected the first and second connections of the unidirectional position detectors as well as a third and fourth terminal, between which the first ohmic resistor is wired.

The interrogation of such a device is effected in two steps:

Initially, a potential difference is applied between the first and second terminals of the device and the resulting voltage across the terminals of the first ohmic resistor is measured so as to determine the X position of the force on the keyboard. After this step, the column in which the activated key is situated is therefore known.

Thereafter a potential difference is applied between the third and fourth terminals of the device, the resulting voltage is measured across the first and second terminals so as to determine the Y position of the force on the keyboard. Thus, it is easy to identify the row of keys in which the activated key is situated.

In contradistinction to "matrix" keyboards, for which an evaluation circuit must scan (sweep) in all (n×m) keys to determine an activation, if any, the keyboard of the present invention requires only the determination of at the very most three different values to evaluate an activation of the keys. Specifically, an interrogation of the keyboard is effected by determining a voltage corresponding to an X position, a voltage corresponding to a Y position and, depending on the realization of the keyboard, possibly a voltage corresponding to the force of the activation of the activated key. As a result, the workload of a processor of the evaluation circuit is markedly reduced as compared with that of a "matrix" keyboard and consequently the energy consumption is reduced. This is very important especially for applications of keyboards in portable appliances such as mobile or cordless telephones.

In an advantageous realization of the invention, said first ohmic resistor comprises a strip of resistive material, said output connections of the unidirectional position detectors being connected at various locations to said strip of resistive material. The ohmic resistor may e.g. be printed as a thick layer on a substrate. This realization is easy to embody and relatively inexpensive. The strip of resistive material is preferably disposed along the active surface of the keyboard so as to reduce the length of the connections required to connect the position detectors to said first resistor. This realization has the advantage of also reducing the complexity of the traces of these conductors.

In another possible realization, said first ohmic resistor comprises a series layout of a plurality of discrete resistors, said output connections of the unidirectional position detectors being connected to the series layout at various locations between discrete resistors. The discrete resistors may comprise discrete resistors laid out over a printed circuit substrate or else simple layers of resistive material printed as a thick layer on a substrate. As in this realization, the position detectors are wired to locations situated between the discrete resistors, this realization makes it possible to reduce the disadvantageous effects of the production tolerances. Another advantage of this realization is due to the fact that the discrete resistors may be disposed in any arrangement whatsoever at a location of the keyboard, which is not subject to mechanical stresses. This advantage is especially important in the case of flexible keyboards, or the resistors may be arranged at a location which is not subject to deformations, e.g. on a coupling tag of the keyboard. Thus deformation-induced degradation of the resistors may be avoided.

In a preferred realization of the invention, a unidirectional position detector comprises a plurality of discrete switches, said switches being connected on one side to the output connection of the position detector and on the other side at various locations to a second ohmic resistor, said second ohmic resistor being connected between the two input connections of the position detector. The discrete switches, e.g. membrane-type breakers or pressure sensors, of such a position detector are connected in voltage divider form to the second ohmic resistor. By applying a potential difference between the terminals of the second ohmic resistor, the signal measured at the output connection of the detector is representative of the position of the switch actuated.

Like the first ohmic resistor, the second ohmic resistor may comprise a strip of resistive material, said switches being connected at various locations to said strip of resistive material or a series layout of a plurality of discrete resistors, said switches being connected to the series layout at various locations between discrete resistors, or a combination of the two. The final choice between these realizations is made as a function of the aforesaid advantages of these realizations.

It should be noted that if the number of resistors of the second ohmic resistor is equal for several unidirectional position sensors and if the resistors have equal values, the points of connection of the switches of a column of keys are equipotential points during the application of a potential difference across the terminals. It is henceforth possible, to wire all the discrete switches belonging to a column of the keyboard up to one and the same point of connection of a single second ohmic resistor.

In another realization, a unidirectional position detector comprises a sensor in the form of a voltage divider, said voltage divider comprising a second ohmic resistor extending substantially along the row of keys of the keyboard, conducting lines extending from the second ohmic resistor and arranged at a certain distance from one another, a comb-like conductor, whose teeth are arranged in an interdigital manner between said conducting lines, and an activation layer made of semiconducting material, in order to short-circuit the conducting lines and the teeth of the conductor at the location of action of the force. In such a realization, the comb-like conductor is connected to the output connection of the position detector and the second ohmic resistor is connected between the two input connections of the position detector. These voltage divider-like sensors are well known in the state of the art and have the advantage of being freely able to define virtual keys by associating a certain range of resistances with each of the keys. This technique therefore makes it possible to define as required several different dispositions of keys with the same detector.

In another realization, a unidirectional position detector comprises several voltage divider-like sensors laid out in series. In this case, the second ohmic resistor is composed of the series layout of the various resistors of the individual sensors.

For the two realizations comprising sensors in the form of voltage dividers, the second resistors are customarily linear resistors, that is to say resistors whose conductivity is uniform throughout their extension. In a possible realization, the second ohmic resistor of the voltage divider-like sensor may by contrast be a nonlinear resistor, that is to say a resistor whose conductivity is different at various locations of the resistor. In this way it is possible to locally vary the lateral resolution of such a sensor, thus making it possible to better detect the position of the activation on the key.

It should be noted that the discretization of the resistors resp. of the switches or sensors has the advantage that the voltages measured in such a realization must lie within well-defined and mutually distinct ranges. This is very important especially when using pressure sensors in the form of switches or in the form of voltage dividers, making it possible not only to localize the action of a force but also to measure their intensity. By thus discretizing the ranges of "valid" voltages, it becomes possible to detect an anomaly in the operation of the keyboard due in particular to an initial load (preload) acting on the keyboard and as appropriate to compensate for such a preload through suitable software.

It will be appreciated that certain of the keys of the keyboard may advantageously be sited close together in such a way as to allow alternate or simultaneous actuation of these keys using a single control element. In a preferred realization of such a keyboard two keys of each direction (X and Y) of the keyboard are sited close together in such a way as to be disposed as a group of four. Actuation of the keys associated with one of the directions may be interpreted by the evaluation circuit coupled to the keyboard as a command to move a cursor in the direction in question. It is thus possible to achieve a "joystick" function so as to make a screen scroll or to shift a cursor over a screen. The control element may be a finger of the user that can rock between the closely sited keys or else a lever disposed above the active keys which serves as joystick.

Such a "joystick" function is easily implementable for the two main directions X and Y of the keyboard. For the X direction, that is to say the direction in which the unidirectional position detectors extend, at least two discrete switches resp. two voltage divider-like sensors of a unidirectional position detector are e.g. disposed at a distance such that alternate or simultaneous actuation of the two discrete switches or voltage divider-like sensors is possible using a control element. In a realization, in which each unidirectional position detector comprises a voltage divider-like sensor and in which virtual keys are defined for a voltage divider-like sensor by associating a certain range of resistances with each of the keys, and in which at least two keys are defined in such a way as to be physically disposed at a distance such that alternate or simultaneous actuation of the two keys is possible using a single control element.

For the Y direction of the keyboard, the function is e.g. achievable if at least two unidirectional position detectors are disposed at a distance such that alternate or simultaneous actuation of the two position detectors is possible using a single control element.

In order to allow multiple assignment of each key of the keyboard using a function key (shift, ctrl, alt), the keyboard preferably comprises at least one third ohmic resistor wired between said first ohmic resistor and the respective terminal of the data input device or between said second ohmic resistor and the respective terminal of the data input device, said third ohmic resistor being short-circuitable with the aid of a bypass circuit including a switch. By short-circuiting the third resistor, the total resistance between the respective terminals is modified and consequently the values of resistances resp. the voltages measured during the activation of a key are transposed into another range of values. This transposition of the measured values makes it possible to differentiate between the "normal" state, in which no function key is activated, and the "special" state, in which a certain function key is activated. The person skilled in the art will appreciate that depending on the sizing of the third resistor, the measured transposition of the values may result in values which lie completely outside the range of normal values or else in values which are intercalated between the normal values. Depending on the resolution of the system, it is even possible to achieve several levels of the intercalated values.

It should be noted that third resistors may advantageously be provided in the two directions of the keyboard thus making it possible to achieve four levels of assignments of keys with two transpositions of values in each direction.

In another realization, the keyboard comprises at least one series layout of a fourth ohmic resistor and of a switch, said series layout being wired up in parallel to said first ohmic resistor or to said second ohmic resistor. This realization makes it possible to detect the present state of the keyboard by measuring the current which passes between the respective terminals of the keyboard. Specifically, if the fourth resistor is wired, through the actuation of the switch, in parallel with the first resp. the second ohmic resistor, the current passing between the terminals in question is higher than if the switch is open. By detecting an increase in this current, the evaluation circuit may therefore detect a special state of the keyboard and may therefore interpret the measured values of the voltages as activation of a special function. As in this realization, the values of the voltages measured across the terminals of the keyboard are not modified, said realization is not subject to limitations of resolution which are present in the case of a transposition of the values. By wiring several resistors in parallel with the first or the second resistor resp. by providing several series layouts comprising four different resistors, it is therefore possible in principle to achieve a multitude of different states of the keyboard.

It should be noted that fourth resistors may advantageously be provided in the two directions of the keyboard.

It is clear that the various realizations for achieving different states of the keyboard may be combined so as to increase the number of possible states.

DESCRIPTION WITH THE AID OF THE FIGURES

Figure 2:
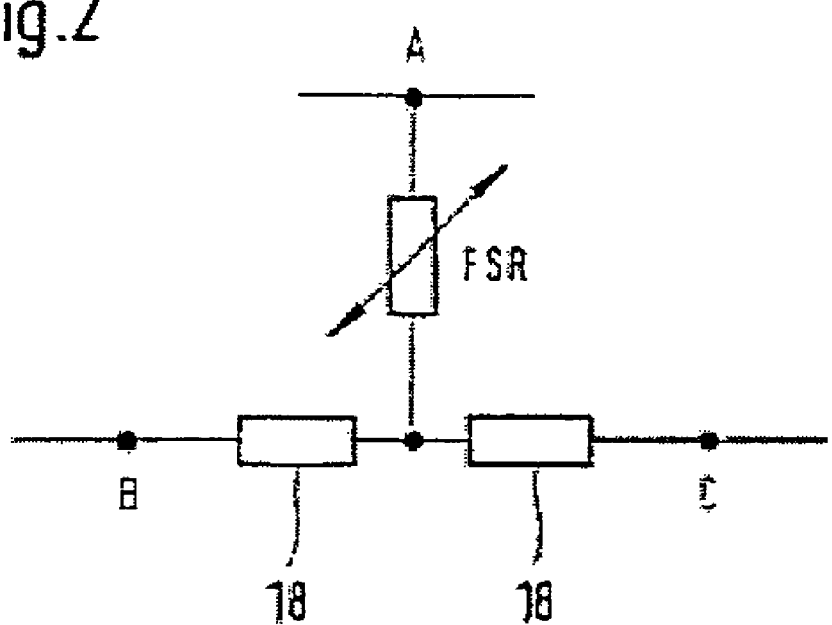
Figure 3:
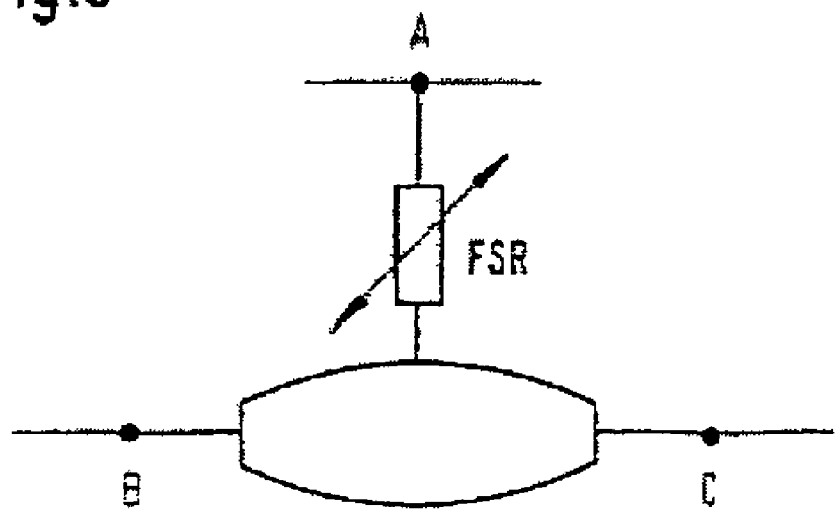
Figure 4:
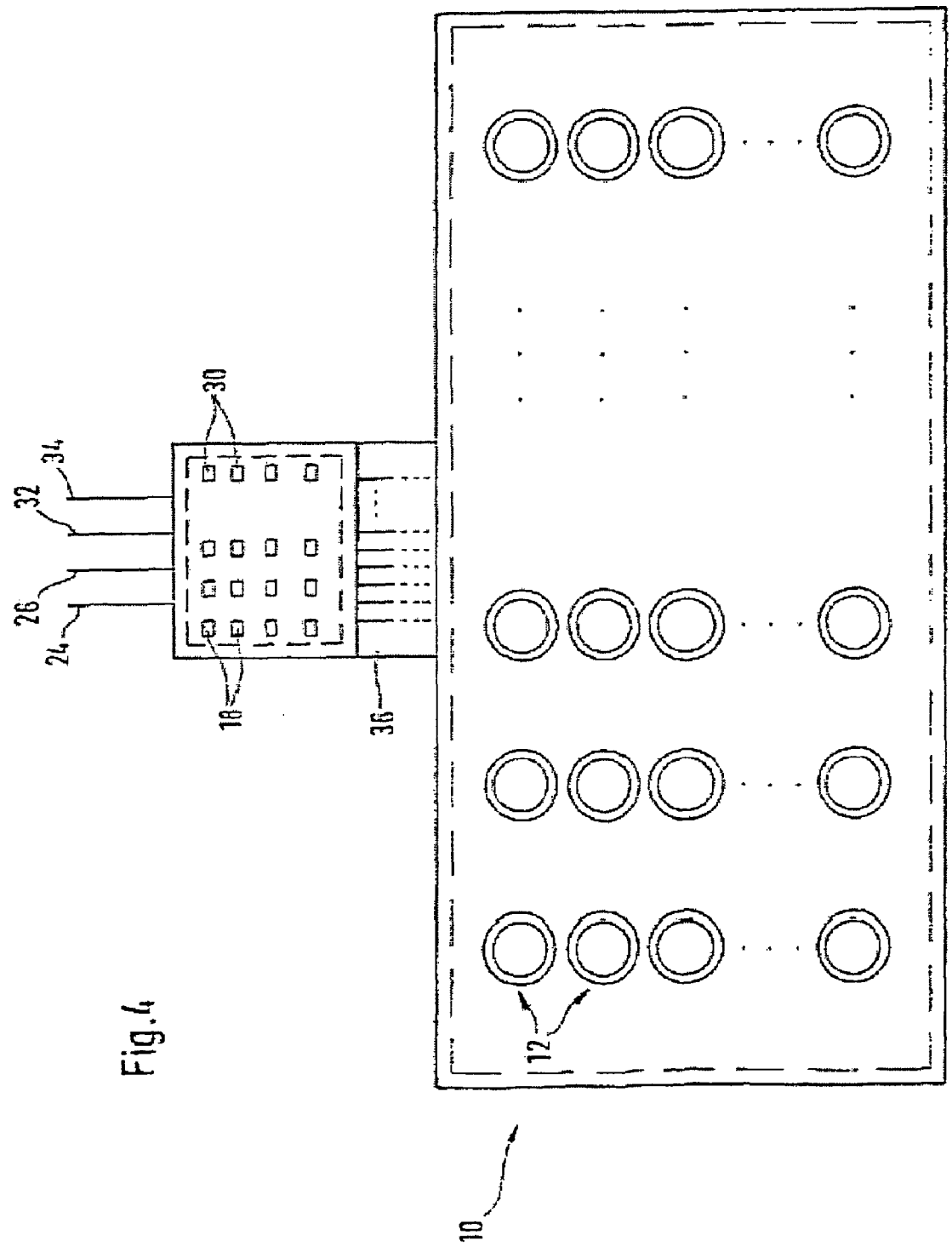
Figure 5:
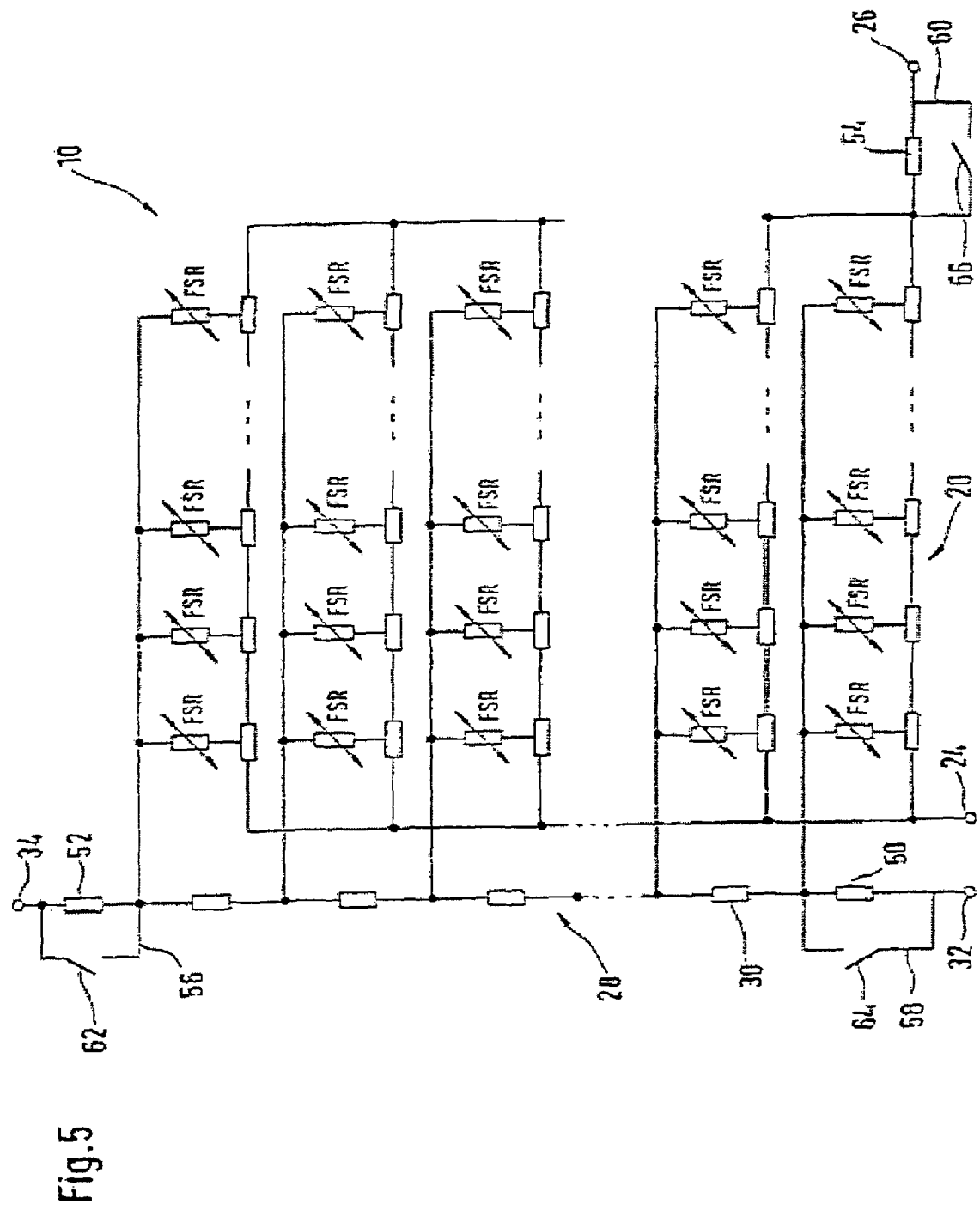
Figure 6:
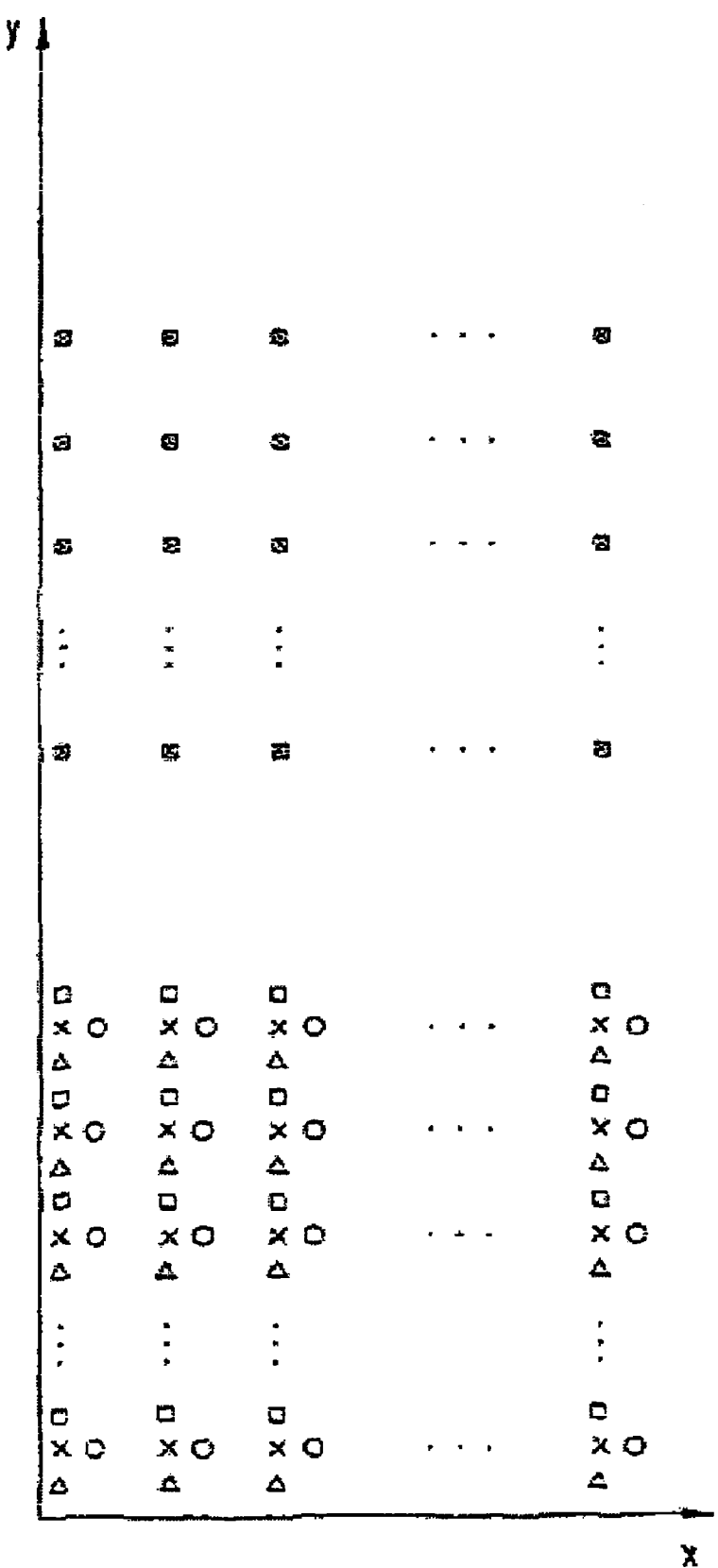
Figure 10:
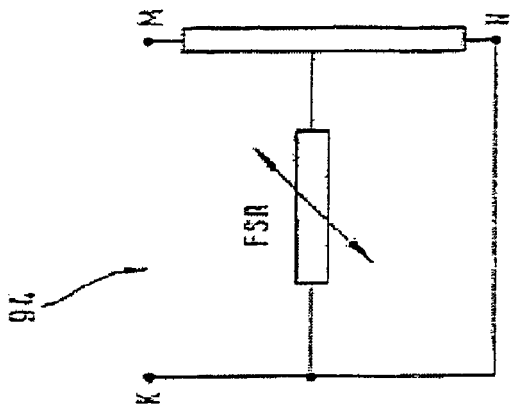
Figure 9:
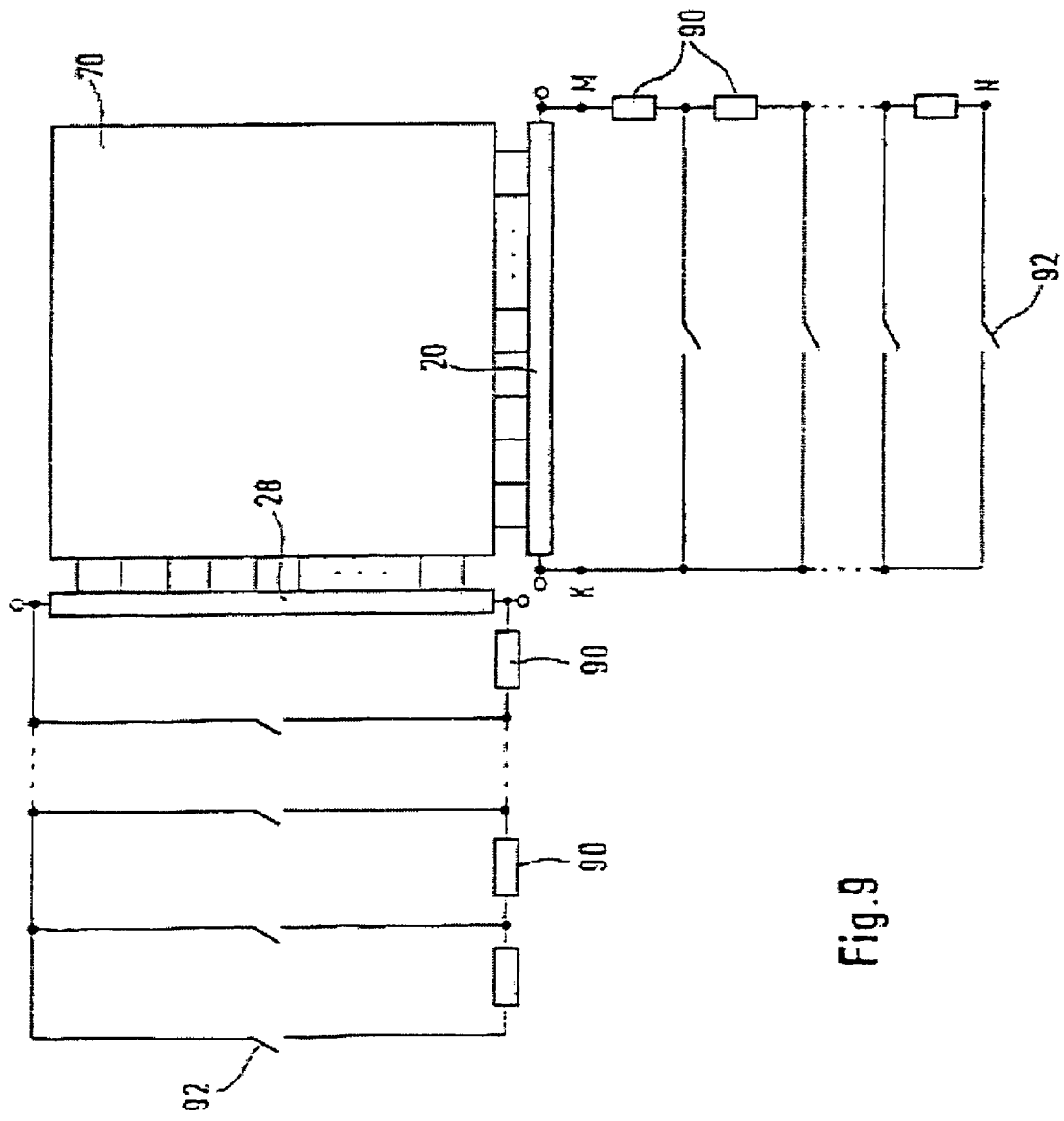
Figure 11:
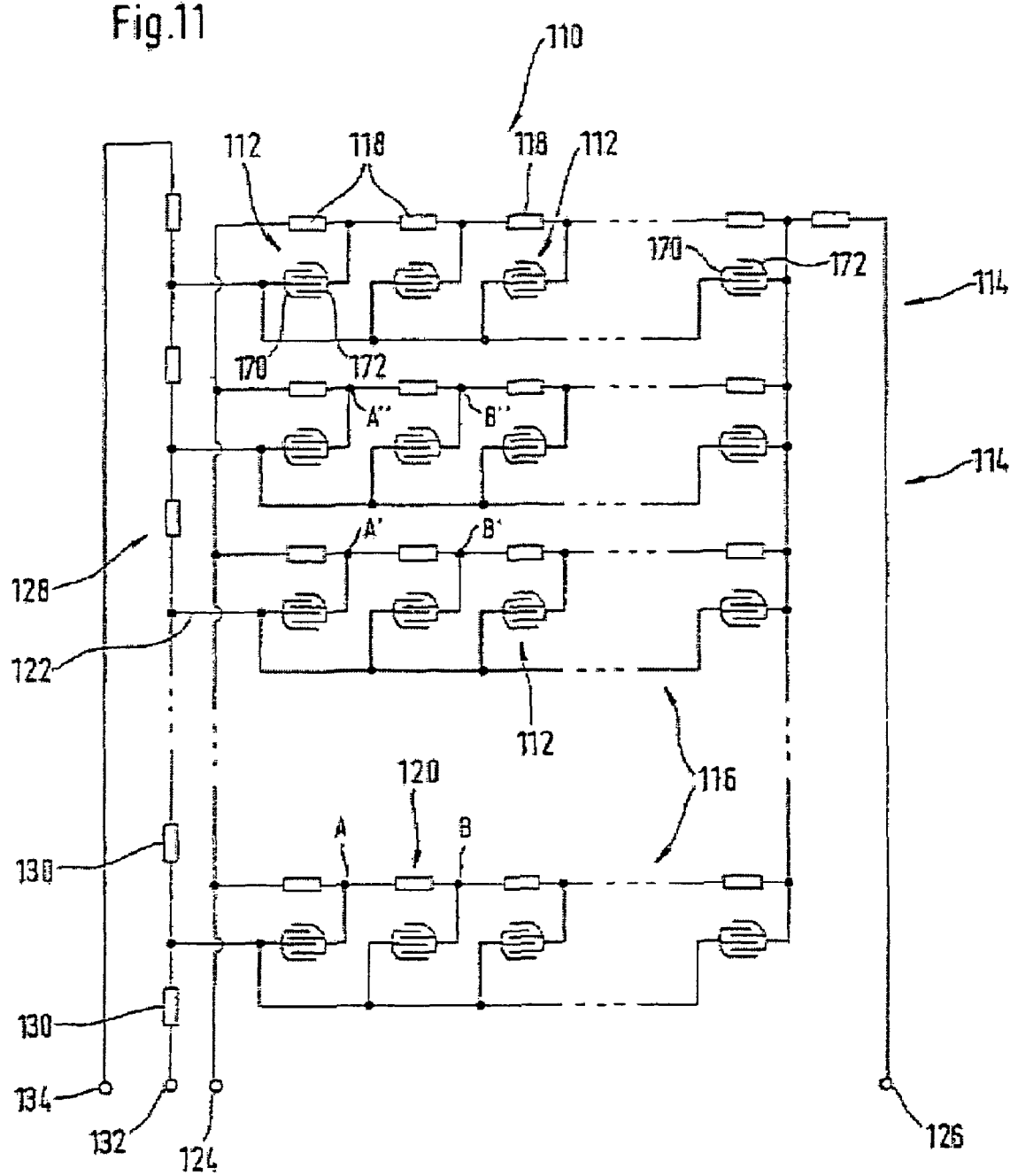
Figure 12:
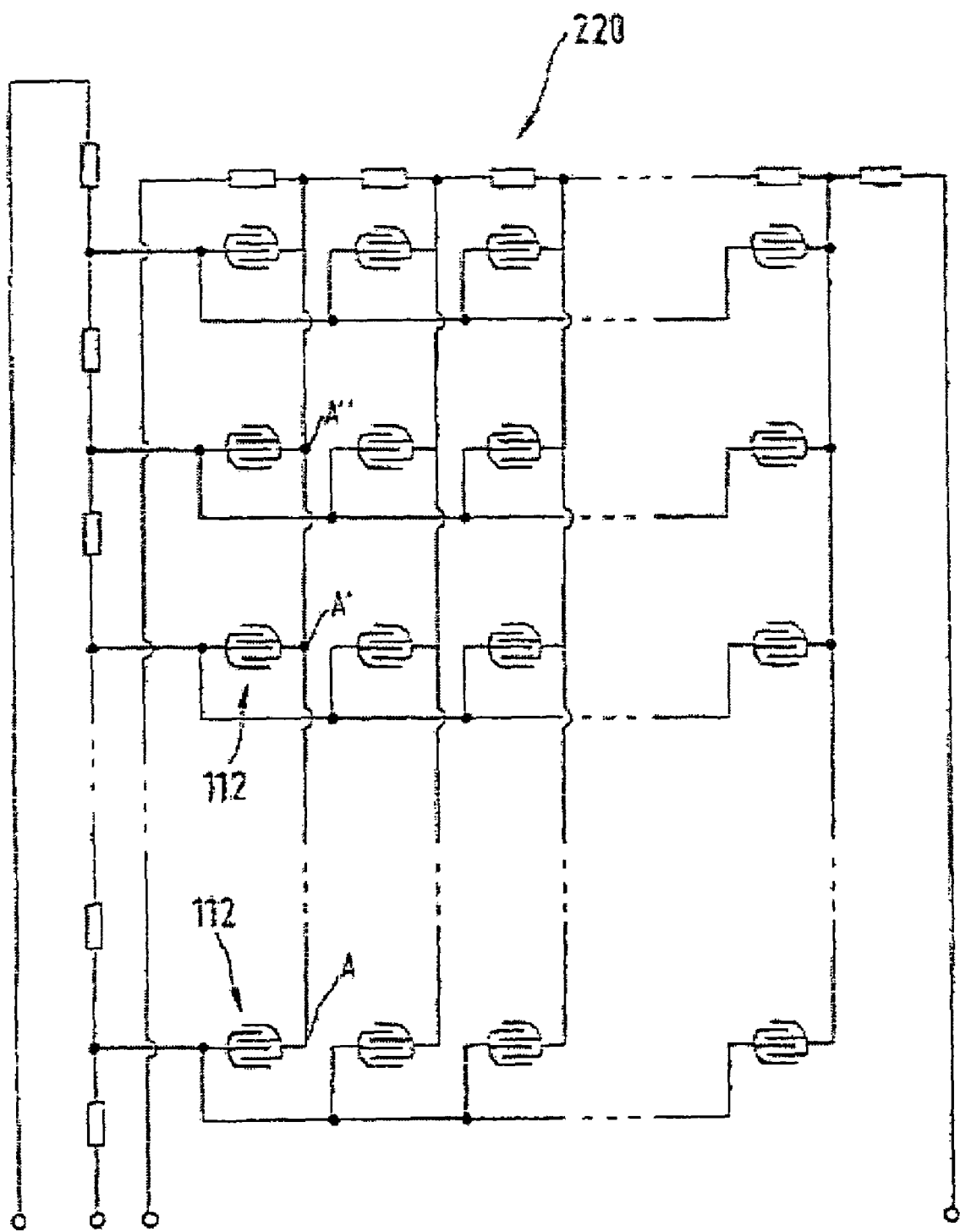

Other features and advantages of the invention will emerge from the detailed description of a few advantageous modes of implementation presented hereinbelow, by way of illustration, with reference to the appended drawings. The latter show:

FIG. 1: a layout diagram of a first realization of a data input device according to the present invention;

FIG. 2: a first variant of the device of FIG. 1;

FIG. 3: a second variant of the device of FIG. 1;

FIG. 4: a view of a possible realization of the device of FIG. 1;

FIG. 5: a layout diagram of a realization of a data input device comprising function keys;

FIG. 6: a graphical representation of the voltage values measured with the device of FIG. 5;

FIG. 7: a layout diagram of a second realization of a data input device comprising function keys;

FIG. 8: a variant of the device of FIG. 7;

FIG. 9: a layout diagram of a third realization of a data input device comprising function keys;

FIG. 10: a variant of the device of FIG. 9;

FIG. 11: a layout diagram of a realization of a data input device according to the present invention comprising discrete switches;

FIG. 12: a layout diagram of a variant of the realization of FIG. 11.

FIG. 1 represents a layout diagram of a realization of a keyboard 10 comprising a plurality of keys 12 diagrammatically represented by variable resistors (FSR).

The keys of the keyboard are represented in a grid arrangement with several rows 14 of keys.

With each row 14 of keys is associated a unidirectional position detector 16. Such a position detector 16 may e.g. comprise several voltage divider-like sensors. Such a voltage divider sensor comprises an ohmic resistor 18 extending substantially along an active surface of the sensor, conducting lines extending from the ohmic resistor and arranged at a certain distance from one another, a comb-like conductor, whose teeth are arranged in an interdigital manner between said conducting lines, and an activation layer of semiconducting material for short-circuiting the conducting lines and the teeth of the conductor at the location of action of the force. As these sensors are well known in the state of the art, the details of the sensors are not represented in FIG. 1. In the figures, the sensors are diagrammatically represented by a variable resistor (FSR) wired on one side to a resistor 18. The voltage divider sensors are wired in series in such a way that the series layout of the resistors 18 constitutes the second ohmic resistor 20 of the device of the present invention. The comb-like conductors of the voltage dividers are connected together to form an outward connection 22 of the position detector.

The respective ends of the ohmic resistors 20 of each unidirectional position detector are connected together to form a first terminal 24 and a second terminal 26 of the keyboard. The output connections of the position detectors are in their turn connected at various locations to a first ohmic resistor 28, formed in the example of FIG. 1 by a layout of various individual resistors 30. In this realization, the output connections 22 of the unidirectional position detectors are connected to the series layout at various locations between discrete resistors 30. The two ends of the ohmic resistor 28, resp. of the series layout of the resistors 30 form the third terminal 32 and the fourth terminal 34 of the keyboard.

It should be noted that FIG. 1 shows a layout diagram of a keyboard, that is to say that the figure does not necessarily represent the physical disposition of the various components of the keyboard. In a physical implementation of a keyboard according to FIG. 1, the resistors 30 do not have to be disposed physically in proximity to the active surface of the keyboard. Specifically it is advantageous, in particular in the case of flexible keyboards, to dispose the resistors at a location of the keyboard which is not subject to deformations. Such a realization of a keyboard is represented in FIG. 4. In this realization, the resistors 30 are disposed on a coupling tag 36 of the keyboard. This coupling tag may be strengthened so as to limit its deformations. Thus a deformation-induced degradation of the resistors 30 may be avoided.

It should be noted that instead of a plurality of voltage divider sensors, the position detector could equally well comprise a single voltage divider sensor which extends throughout the width of the row of keys. In the latter case, the various keys are virtually delimited by associating with each key a well-defined range of resistances on the second ohmic resistor.

In another possible realization of the position detector, the latter comprises a plurality of switches wired with one of their voltage divider-like contacts either to an ohmic resistor or to a series layout of resistors 18. The other contacts of the switches are connected together to form an output connection 22 of the position detector. The switches of the position sensor may be simple membrane-type breakers or in an advantageous realization, pressure sensors e.g. of the "Force Sensing Resistor" type described above. Such a realization with FSR sensors is shown diagrammatically in FIG. 2. It should be noted that with this realization, the resistors 18 do not have to be disposed in proximity to the keys of the keyboard but may, just like the resistors 30, be disposed in the coupling tag 36 of the keyboard (FIG. 4).

FIG. 3 shows another variant of the position sensors. In this variant, the position detectors comprise sensors in the form of voltage dividers, in which the resistor 18 is a nonlinear resistor, that is to say a resistor whose conductivity is different at various locations of the resistor. In the case represented, the conductivity is higher at the center of the sensor than at the edges. In this way it is possible to locally vary the lateral resolution of such a sensor, thus making it possible to better detect the position of the activation on the key.

FIG. 5 shows a layout diagram of a realization of a data input device comprising function keys. In order to allow multiple assignment of each key of the keyboard using a function key (shift, ctrl, alt), this keyboard comprises additional resistors 50 and 52 which are wired to the ends of the ohmic resistor 28 between the latter and the terminals 32 and 34 respectively. Likewise, an additional resistor 54 is wired between the ends of the second ohmic resistors 20 and the terminal 26. Each of the resistors 50, 52, 54 is short-circuitable with the aid of a bypass circuit 56, 58, 60 including a switch 62, 64, 66. By short-circuiting one of the resistors 50, 52, 54, the total resistance between the respective terminals is modified and consequently the values of resistances resp. the voltages measured during the activation of a key are transposed into another range of values. This transposition of the measured values makes it possible to differentiate between the "normal" state in which no function key is activated, and the "special" state in which a certain function key is activated. The person skilled in the art will appreciate that depending on the sizing of the resistors, the measured transposition of the values may result in values which lie completely outside the range of normal values or else in values which are intercalated between the normal values. Depending on the resolution of the system, it is even possible to achieve several levels of the intercalated values.

FIG. 6 shows a graphical representation of the voltage values measured with the device of FIG. 5. In the graph, the points marked by a cross represent voltage values measured during the activation of the keys of the keyboard when none of the switches 62, 64, 66 is actuated. When the switch 64 is actuated, the voltages applied to the various resistors are lowered and the voltages measured for the locating of a key in the Y direction are lowered with respect to the normal values. These lowered values are represented by the triangles.

On the other hand, if the switch 64 is actuated, the voltages applied to the various resistors are increased and the voltages measured for the locating of a key in the Y direction are increased with respect to the normal values. Two cases may then arise:

if the value of the resistor 52 is less than that of the resistors 30, the increase in the voltages applied to the resistors 30 is less than the voltage difference between two consecutive resistors 30. In this case, the voltages measured during the locating of a key in the Y direction are only slightly increased with respect to the normal values and are intercalated between these normal values. These increased values are represented by the squares.

if on the other hand the resistor 52 is considerably greater than the sum of the resistors 30, the potential difference applied across the series layout of the resistors 30 changes radically. In this case, the measured values may be transposed into a span of the graphic, which lies completely outside the range of normal values. This case is represented by the barred squares in the upper part of the graphic.

The values transposed during the activation of the switch 66 are represented in FIG. 6 by circles. These values are increased with respect to the normal values by reason of the increase in the potential difference applied to the ohmic resistors 20 following the short-circuiting of the resistor 54. It should be noted that another additional resistor could be provided between the other end of the ohmic resistors 20 and the terminal 24.

FIGS. 7 to 10 show several realizations of another keyboard with function keys. In these figures the activation zone of the keyboard is diagrammatically represented at 70 and the ohmic resistors 28 and 20 are represented as resistive strips.

In the realization of FIG. 7 and FIG. 8, the keyboard comprises several series layouts 72 of an ohmic resistor 74 and of a switch 76, which are wired in parallel to the first ohmic resistor 28 respectively to the second ohmic resistor 20. This realization makes it possible to detect the present state of the keyboard by measuring the current which passes between the respective terminals of the keyboard. Specifically, if one of the resistors 74 is wired, through the action of the associated switch 76, in parallel with the first resp. the second ohmic resistor 28 resp. 20, the current passing between the terminals in question is higher than if the switch 76 is open. By detecting an increase in this current, the evaluation circuit may therefore detect a special state of the keyboard and henceforth interpret the measured values of the voltages as activation of a special function. It should be noted that values of resistance of the various resistors for each direction are preferably different from one another so as to be able to distinguish the switch which has been actuated. In another possible realization, all the resistors may be equal and the distinction of the various states of the keyboard is done via the number of switches 76 actuated simultaneously. It remains to be noted that the switches may comprise simple membrane-type breakers or force sensors of the FSR type as represented in FIG. 8.

Another version of a keyboard is represented in FIGS. 9 and 10. In this realization, an ohmic resistor or a series layout of discrete resistors 90 may be wired in parallel with the resistor 28 and with the resistor 20 by means of switches 92. Conducting lines comprising a switch are provided between the various resistors 90 and a common terminal K, in such a way as to be able to short-circuit a part of the series layout of the resistors 90. In this way it is easy to achieve a parallel layout of the resistor 28 resp. 20 with a variable "ohmic resistor".

In an advantageous implementation of such a realization, an FSR linear potentiometer 94 is wired in parallel with the resistors 28 resp. 20. Such a realization is represented diagrammatically in FIG. 10. This variant makes it possible to continuously vary the parallel resistance applicable between the terminals 24 and 26 as a function of the location of activation of the potentiometer 94 and thus to define a multitude of virtual function keys and consequently of special states.

The person skilled in the art will appreciate that the technical measures described hereinabove for the deployment of the function keys will be applicable to any resistive keyboard, that is to say one which operates according to a principle of measuring resistances so as to identify an activated key, such as e.g. keyboards with YX or YXZ digitizing tablets. Moreover, all these measures may be deployed without needing to increase the number of contacts with the exterior. Specifically it will be appreciated that in the devices described hereinabove with the aid of FIGS. 5 to 10, the number of terminals for coupling of the keyboard remains unchanged with respect to that of the device described with reference to FIGS. 1 to 4.

It remains to be noted that all the possible realizations described hereinabove are preferably achieved in the guise of membrane keyboard. In such an implementation, the ohmic resistors 18, 30, 50, 52, 54, 74, 90, the conducting lines, the comb-like conductors and the layers of semiconductor material of the voltage divider sensors, the contacts of the switches 60, 62, 64, 72, 92 and the conductors connecting the various elements are preferably deposited (e.g. printed) on flexible substrates (insulating films made of plastic, textiles etc.), which are thereafter laminated together. This technique makes it possible to produce keyboards of high quality at reasonable cost.

FIG. 11 represents a layout diagram of a realization of a keyboard 110 comprising a plurality of keys configured as discrete switches 112. Just as for the keyboard 10 of FIG. 1, the keys 112 of the keyboard 100 are arranged in a grid with several rows 114 of keys. With each row 114 of keys is associated a unidirectional position detector 116 comprising several discrete switches 112.

Each discrete switch comprises two comb-like electrode structures 170 and 172 which are disposed in such a way that the fingers of one of the comb-like structures are interpolated at a certain distance with the fingers of the other structure. An activation layer, which may be a simple conducting layer or else a pressure sensitive layer, is arranged on a second substrate (not represented) in such a way that the two structures 170 and 172 of a discrete switch are short-circuited by the activation layer when a force acts on the device in the region of the discrete switch.

Each of the discrete switches is connected on one side to the output connection 122 of the position detector 116 and on the other side at various locations to a second ohmic resistor 120 consisting of a chain of discrete resistors 118, which is connected between the two input connections of the position detector which form the terminals 124 and 126 of the keyboard.

The discrete switches 112, e.g. membrane-type breakers or pressure sensors, of such a position detector are therefore connected in voltage divider form to the second ohmic resistor 120. By applying a potential difference between the terminals of the second ohmic resistor 120, the signal measured at the output connection of the detector is representative of the position of the switch actuated.

The output connections 122 of the position detectors 116 are in their turn connected at various locations to a first ohmic resistor 128, formed in the example of FIG. 11 by a layout of various individual resistors 130. In this realization, the output connections 122 of the unidirectional position detectors are connected to the series layout at various locations between discrete resistors 130. The two ends of the ohmic resistor 128 resp. of the series layout of the resistors 130, form the third terminal 132 and the fourth terminal 134 of the keyboard.

If the number of resistors 118 is equal for all the unidirectional position sensors 116 and if the resistors 118 have equal values, the connection points A, A', A" etc. are equipotential points during the application of a potential difference across the terminals 124 and 126. The same holds for the connection points B, B', B" etc.

It is henceforth possible to wire all the discrete switches 112 belonging to a column of the keyboard up to one and the same point of connection of a single second ohmic resistor 220. Such a variant of the keyboard is represented in FIG. 12.

LIST OF REFERENCE SIGNS

10, 110 Keyboard
12, 112 Key
14, 114 Row of keys
16, 116 Position detector
18, 118 Ohmic resistor
20, 120 Ohmic resistor
22, 122 Output connection of the position detector
24, 124 First terminal
26, 126 Second terminal
28, 128 First ohmic resistor
30, 130 Individual resistors 32, 132 Third terminal
34, 134 Fourth terminal
36 Coupling tag
50, 52, 54 Additional resistors
56, 58, 60 Bypass circuits
62, 64, 66 Switches
70 Activation zone of the keyboard
72 Series layout
74 Ohmic resistor
76 Switch
90 Discrete resistors
92 Switch
94 FSR linear potentiometer

The invention claimed is:

1. A data input device, comprising:
first, second, third and fourth terminals;
plural keys, said keys being arranged in at least two rows;
a first ohmic resistor, a first end of said first ohmic resistor forming the third terminal of the data input device and a second, opposite, end of said first ohmic resistor forming the fourth terminal of the data input device; and
a plurality of unidirectional position detectors, each unidirectional position detector being associated with one of said at least two rows of keys, respectively, each of the plurality of unidirectional position detectors including
a first input connection, a second input connection, and an output connection, and
at least one voltage divider sensor having a second ohmic resistor extending substantially along said one of said at least two rows of keys associated with said unidirectional position detector, a first end of said second ohmic resistor forming the first input connection of said unidirectional position detector, and a second, opposite, end of said second ohmic resistor forming the second input connection of said unidirectional position detector, wherein
the output connections of each of the plurality of unidirectional position detectors are connected to said first ohmic resistor at different locations between said first and second ends of said first ohmic resistor, and
the first input connections of each of the plurality of unidirectional position detectors are connected together to form said first terminal of the data input device and the second input connections are connected together to form said second terminal of the data input device.

2. The device as claimed in claim 1, wherein said first ohmic resistor includes a strip of resistive material.

3. The device as claimed in claim 1, wherein said first ohmic resistor includes a series layout of a plurality of discrete resistors, said output connections of the unidirectional position detectors being connected to the series layout alternatingly between said plurality of discrete resistors.

4. A data input device, comprising:
first, second, third and fourth terminals;
plural keys, said keys being arranged in at least two rows;
a first ohmic resistor, a first end of said first ohmic resistor forming the third terminal of the data input device and a second, opposite, end of said first ohmic resistor forming the fourth terminal of the data input device; and
a plurality of unidirectional position detectors, each unidirectional position detector being associated with one of said at least two rows of keys, respectively, each of the plurality of unidirectional position detectors including
a first input connection, a second input connection, and an output connection,
a second ohmic resistor, a first end of said second ohmic resistor forming the first input connection and a second, opposite end of said second ohmic resistor forming the second input connection, and
a plurality of discrete switches, said plurality of discrete switches being connected on a first side to the output connection of the position detector and on the other side to said second ohmic resistor at different locations between the first and second input connections of the position detector, wherein
the output connections of the unidirectional position detectors are connected to said first ohmic resistor at different locations between said first and second ends of said first ohmic resistor, and
the first input connections of said unidirectional position detectors are connected together to form said first terminal of the data input device and the second input connections are connected together to form said second terminal of the data input device.

5. The device as claimed in claim 4, wherein said second ohmic resistor includes a strip of resistive material.

6. The device as claimed in claim 4, wherein said second ohmic resistor includes a series layout of a plurality of discrete resistors, said switches being connected to the series layout alternatingly between said plurality of discrete resistors.

7. The device as claimed in claim 1, wherein the voltage divider sensor of each of said plurality of unidirectional position detectors includes,
conducting lines extending from the second ohmic resistor and arranged at a certain distance from one another,
a comb-like conductor, whose teeth are arranged in an interdigital manner between said conducting lines, and
an activation layer made of semiconducting material, wherein
the comb-like conductor is connected to the output connection of the respective unidirectional position detector and the second ohmic resistor is connected between the two input connections of the respective unidirectional position detector.

8. The device as claimed in claim 7, wherein the second ohmic resistor is a nonlinear resistor.

9. A data input device, comprising:
first, second, third and fourth terminals;
plural keys, said keys being arranged in at least two rows;
a first ohmic resistor, a first end of said first ohmic resistor forming the third terminal of the data input device and a second, opposite, end of said first ohmic resistor forming the fourth terminal of the data input device; and
a plurality of unidirectional position detectors, each unidirectional position detector being associated with one of said at least two rows of keys, respectively, each of the plurality of unidirectional position detectors including
a first input connection, a second input connection, and an output connection,
voltage divider-like sensors in a form of a voltage divider, said voltage divider-like sensors being laid out in series, each of said voltage divider-like sensor including
a second ohmic resistor extending substantially along the row of keys,
conducting lines extending from the second ohmic resistor and arranged at a certain distance from one another, a comb-like conductor, having teeth arranged in an interdigital manner between said conducting lines, and an activation layer made of semiconductor material, wherein the output connections of the unidirectional position detectors are connected to said first ohmic resistor at different locations between said first and second ends of said first ohmic resistor, and the first input connections of said unidirectional position detectors are connected together to form said first terminal of the data input device and the second input connections are connected together to form said second terminal of the data input device.

10. The device as claimed in claim 9, wherein the second ohmic resistor of the voltage divider-like sensor is a nonlinear resistor.

11. The device as claimed in claim 1, further comprising:
at least one third ohmic resistor wired between said first ohmic resistor and the respective terminal of the data input device, said third ohmic resistor being short-circuitable with aid of a bypass circuit including a switch.

12. The device as claimed in claim 4, further comprising:
at least one third ohmic resistor wired between said second ohmic resistor and the respective terminal of the data input device, said third ohmic resistor being short-circuitable with aid of a bypass circuit including a switch.

13. The device as claimed in claim 7, further comprising:
at least one third ohmic resistor wired between said second ohmic resistor and the respective terminal of the data input device, said third ohmic resistor being short-circuitable with aid of a bypass circuit including a switch.

14. The device as claimed in claim 1, further comprising:
at least one series layout of a third ohmic resistor and of a switch, said series layout being wired in parallel to said first ohmic resistor.

15. The device as claimed in claim 4, further comprising:
at least one series layout of a third ohmic resistor and of a switch, said series layout being wired in parallel to said first ohmic resistor.

16. The device as claimed in claim 4, wherein at least two discrete switches are disposed at a distance such that alternate or simultaneous actuation of the two discrete switches is possible using a single control element.

17. The device as claimed in claim 9, wherein at least two voltage divider-like sensors are disposed at a distance such that alternate or simultaneous actuation of the two voltage divider-like sensors is possible using a single control element.

18. The device as claimed in claim 9, wherein virtual keys are defined for said voltage divider-like sensor by associating a certain range of resistance with each of the keys, and wherein at least two keys are defined in such a way as to be physically disposed at a distance such that alternate or simultaneous actuation of the two keys is possible using a single control element.

19. The device as claimed in claim 1, wherein at least two unidirectional position detectors are disposed at a distance such that alternate or simultaneous actuation of the two position detectors is possible using a single control element.

20. The device as claimed in claim 3, wherein said discrete resistors are disposed on a coupling tag of a flexible keyboard at a location which is not subject to a deformation.

* * * * *